United States Patent [19]

Aigo

[11] Patent Number: 5,014,727
[45] Date of Patent: May 14, 1991

[54] BUBBLER DEVICE FOR WASHING SEMICONDUCTOR MATERIALS

[76] Inventor: Seiichiro Aigo, 3-15-13, Negishi, Daito-ku, Tokyo, Japan

[21] Appl. No.: 452,746

[22] Filed: Dec. 21, 1989

[30] Foreign Application Priority Data

Feb. 27, 1989 [JP] Japan .............................. 1-21644[U]

[51] Int. Cl.⁵ .............................................. B08B 3/08
[52] U.S. Cl. ................................... 134/102; 134/184; 134/902; 261/122
[58] Field of Search ....................... 134/102, 184, 902; 68/183; 261/122

[56] References Cited

U.S. PATENT DOCUMENTS 2,541,838  2/1951  Shardlow .................... 261/122 X
3,396,950  8/1968  Wood ............................. 261/122
4,288,394  9/1981  Ewing et al. .................. 261/122

Primary Examiner—Philip R. Coe
Attorney, Agent, or Firm—Wegner & Bretschneider

[57] ABSTRACT

A bubbler device is disclosed, which comprises of a suitable number of bubbling portions and is located on the bottom in a rinse vessel for washing semiconductor materials set in a carrier. The respective bubbling portions have a filter consisted of a fine mesh which enables passage of gas but hinders penetration of liquid, to thereby generate bubbles through the filter so as to promote the washing of semiconductor materials without penetration of the liquid. The filter is releasably mounted on the upper side of the bubbling portion.

4 Claims, 3 Drawing Sheets

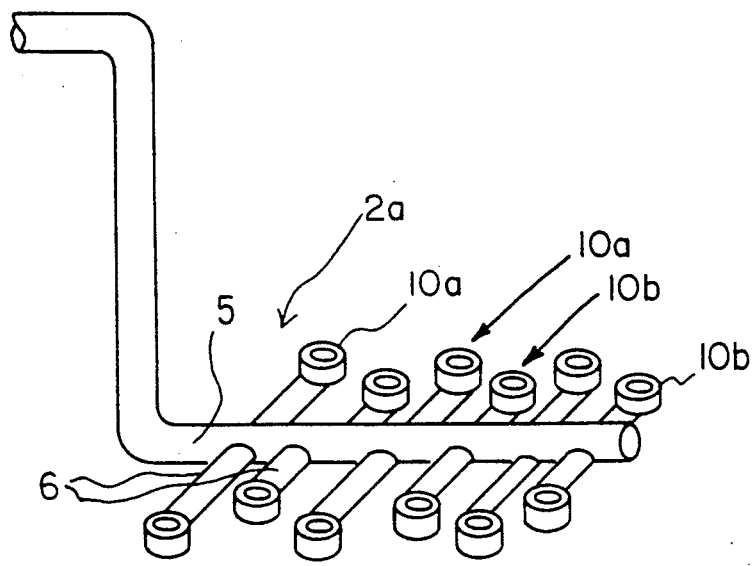
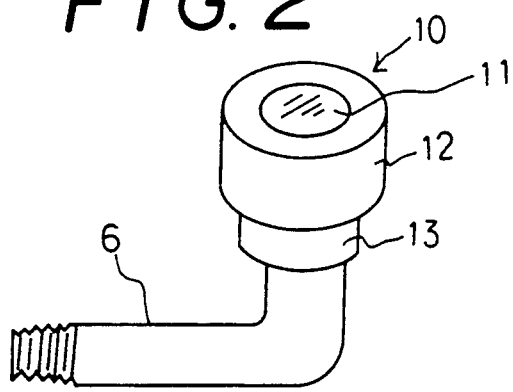
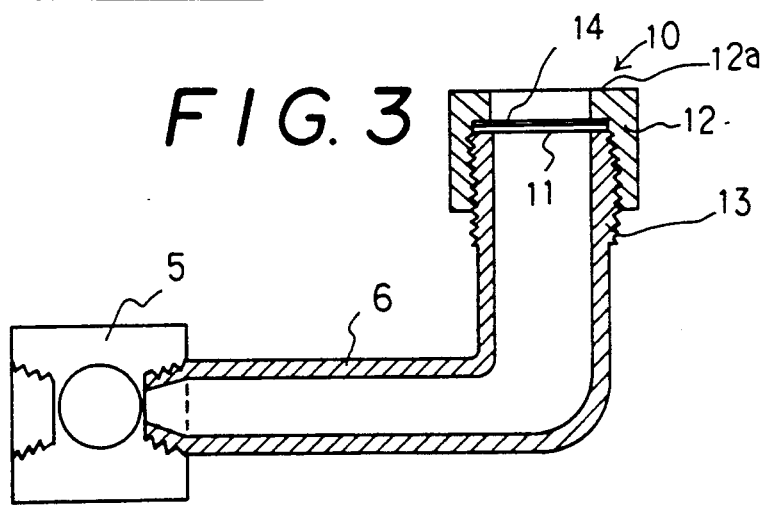

BUBBLER DEVICE FOR WASHING SEMICONDUCTOR MATERIALS

BACKGROUND OF THE INVENTION

1. Field of the Invention

This invention relates to a bubbler device for washing semiconductor materials (wafers) set in a carrier within a rinse vessel.

2. Description of the Prior Art

Usually, in the process of producing semiconductor wafers, a suitable number of wafers, for example 25 to 50 sheets as one lot, will be treated and those wafers housed in a carrier will be washed. In a commonly accepted technique, the apparatus for washing semiconductor wafers set in a carrier, for example, such as shown in FIGS. 6-8, is known. This sort of apparatus includes a rinse vessel, in which pure water or chemical liquid is introduced, and a bubbler device located on the bottom of the vessel, as shown in FIG. 6. A carrier including a series of semiconductor wafers therein is set within the rinse vessel by means of an arbitrary supporting frame, and the bubbler serves to stir the liquid within the rinse vessel so as to facilitate contacts between the respective wafers and the liquid for washing the wafers.

Such a bubbler device, as shown in FIG. 7, consists of a main pipe which connects to a gas feeding apparatus, a suitable number of branch pipes which branch off from the main pipe and the bubbling portions located on the end of the respective branch pipes for the generation of bubbles. These constituent parts are made of fluorine resin or quartz, etc. Each bubbling portion is integrally formed with the branch pipe which is fastened to the main pipe by means of welding or adhesion so that they are integrally formed. The respective bubbling portions are formed with many fine holes.

These conventional bubbler devices described above have some drawbacks and problems as will be pointed out below. Since the bubbling portion has many fine holes formed thereon through which bubbles are generated, the liquid in the rinse vessel will enter the respective bubbling portions and the pipes through these holes. Accordingly, a quantity of the liquid will be contained in the bubbler device, so that it reduces the gas passages in the pipes to thereby hinder the gas flow. Also, bacteria will occur in the liquid held within the bubbler device, which results in contamination of the liquid. Otherwise, if there is a difference in height between both sides of the bubbling portions, the liquid held in the bubbler will block up the fine holes of the bubbling portions on one side which then can not generate bubbles.

SUMMARY OF THE INVENTION

Therefore, an object of the invention is to solve the aforementioned drawbacks and problems of the prior art and accordingly to provide an improved bubbler device which prevents the liquid in the rinse vessel from entering the interior of the bubbler device through the bubbling portions.

In attaining the above object, a bubbler device, according to the present invention, comprises of filters having a fine mesh mounted on the upper side of the respective bubbling portions located at the end of the branch pipes, the said filter per se or together with the branch pipe being exchangeable. Bubbles are generated through the filter in order to promote the washing of semiconductor materials.

In the washing of semiconductor materials set in a carrier within the rinse vessel, gas passing through the main pipe is fed to the respective bubbling portions and discharged through the filters into the liquid in the rinse vessel to generate bubbles. Then, gas can pass through the fine mesh of the filter upwards, while the liquid in the vessel can not pass through the filter mesh due to the surface tension of the liquid. Thus, the liquid does not enter the interior of the bubbler.

BRIEF DESCRIPTION OF THE DRAWINGS

FIG. 1 is a perspective view of an embodiment of a bubbler device according to the invention;

FIG. 2 is a perspective view showing a portion of the bubbler device;

FIG. 3 is a vertical cross-sectional view of the portion shown in FIG. 2;

DETAILED DESCRIPTION OF THE INVENTION AND THE PREFERRED EMBODIMENTS

Figure 4:
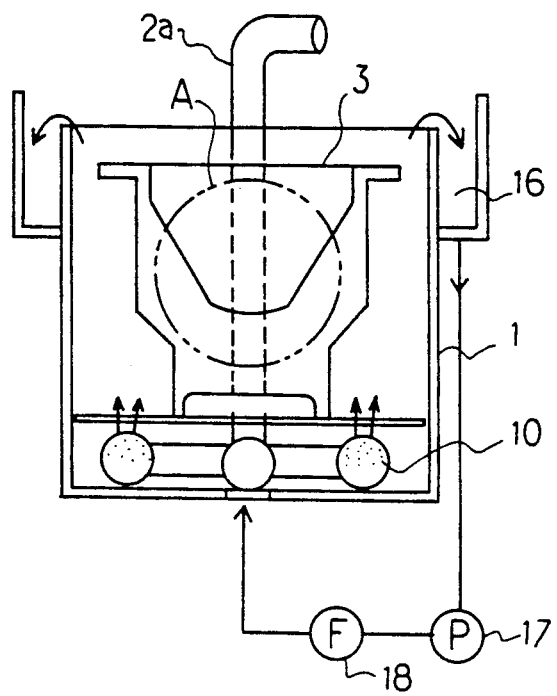
FIG. 4 is a simplified vertical cross-sectional view of a washing apparatus having a bubbler device therein.
Figure 5:
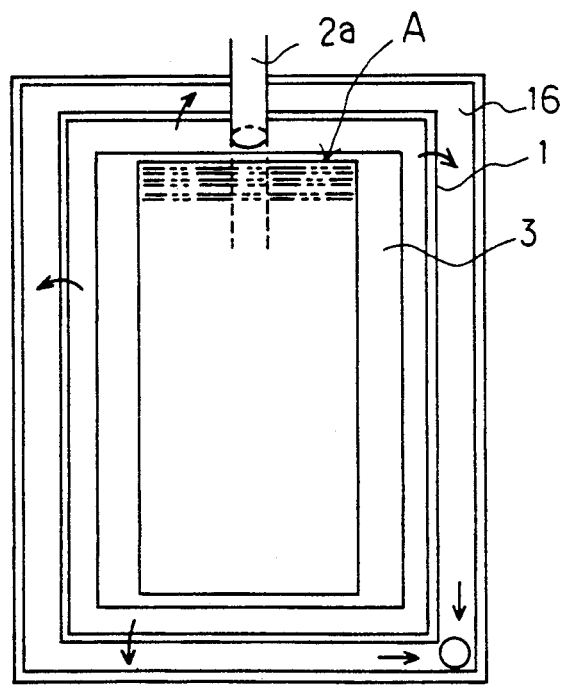
FIG. 5 is a plan view of the washing apparatus.
Figure 6:
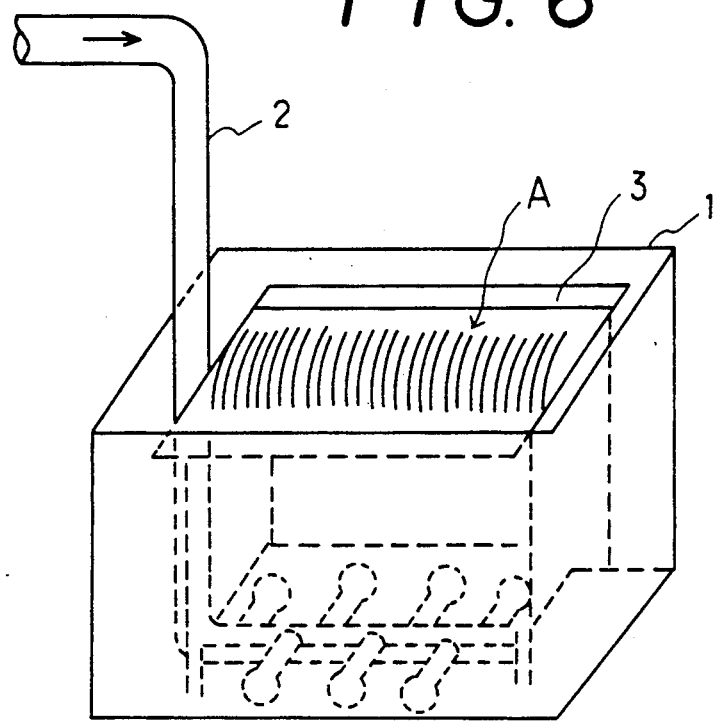
FIG. 6 is a perspective view of a prior art washing apparatus having a bubbler device therein.

The invention will now be described with reference to the preferred embodiments. As shown in FIGS. 4 and 5, a bubbler device (2a) according to the invention is also located on the bottom within a rinse vessel (1) and below a carrier (3) including semiconductor wafers (A) to be washed, the said carrier being immersed in the liquid within the rinse vessel (1). The bubbler device serves to generate bubbles in order to stir the liquid within the vessel.

The bubbler device (2a), as shown in FIG. 1, consists of a main pipe (5) which communicates with a gas feeding unit, such as a fan or a compressor, a suitable number of branch pipes (6) which branch off from the main pipe (5) and bubbling portions (10) located on the end of the respective branch pipes (6). The branch pipes (6) are of at least two different lengths which are alternately disposed, longer and shorter, on each side of the main pipe (5). The bubbling portions disposed at the ends of said branch pipes are therefore alternately disposed farther (10a) and nearer (10b) to the main pipe (5). In addition, a gas such as nitrogen gas, ozone, air or other suitable gases will be used as the gas released through the bubbler.

The feature of the bubbler device according to the invention, as shown in FIGS. 1, 2 and 3, is to employ a filter (11) with a fine mesh mounted on the bubbling portion (10) instead of the formation of many fine holes, and therefore to release gas through such filter (11) into the liquid within the rinse vessel. Preferably, the mesh of the filter (11) is of a mesh with $0.1\mu$ to $0.05\mu$, for example, a membrane filter.

The filter (11) per se or together with a branch pipe (6) on which the relevant filter is mounted is exchangeably arranged. Thus in an embodiment, the filter (11) will be releasably mounted on the upper side of the bubbling portion (10) by means of a cap (12). The outer periphery of the body (13) of the bubbling portion (10)

is preferably cylindrically formed to form screw-threads thereon which engage with screw-threads of the inner periphery of the cap (12) to fix the same. Preferably the filter (11) is located together with a filter support member (14) between the end face of the body (13) of the bubbling portion (10) and the inner surface of inwardly projected flanged portion (12a) of the cap (12), the said support member being a permeable plate, such as a porous plate or a grating member. Otherwise the cap (12) will be fixed by another method, other than the screw-threaded engagement, for example, the cap will be releasably fixed in position by one-touch typed or snap-typed engagement using an inlaid fitting. Therefore, it is apparent that the cap (12) and the body (13) of the bubbling portion (10) may not be necessarily circular-cylindrical and thus they may be polygonal or of another form.

Also the main pipe (5), the branch pipes (6), the body (13) of the bubbling portion (10) and the cap (12) are made of fluorine resin, quartz, PVC, etc. As shown in FIG. 3, the body (13) of the bubbling portion is formed integrally with the branch pipe (6) which is releasably mounted on the main pipe (5) by a screw-threaded engagement or the like. In another embodiment, the cap (12) is secured to the bubbling portion body (13) by means of welding or adhesion, where the filter (11) is exchangeable together with the branch pipe (6) secured thereto.

The rinse vessel (1) is desirably provided with a conduit (16) around it, as shown in FIG. 4. Liquid used for washing, such as, pure water or chemical liquid for rinse, is introduced into the vessel (1) from the bottom thereof through a filter (18) by means of a pump (17), flows over the top periphery of the vessel (1) into the conduit (16) through which the liquid goes back to the pump (17) and circulates as mentioned above by the pump.

Figure 7:
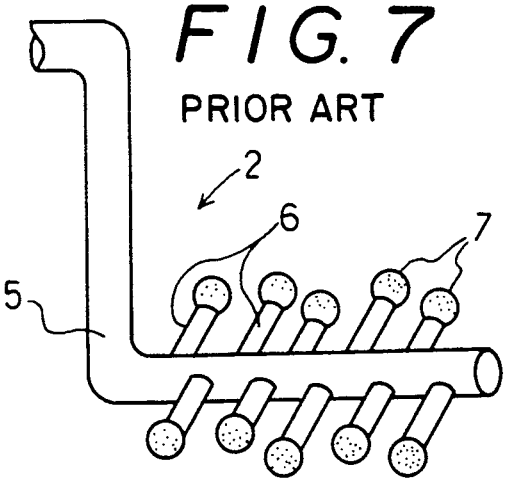
FIG. 7 is a perspective view showing a prior art bubbler device.
Figure 8:
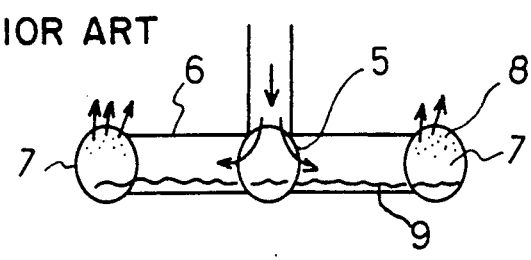
FIG. 8 is a simplified, partial cross-sectional view of a prior art bubbler device.

In operation, a carrier (3) including semiconductor wafers (A) therein is immersed in the liquid within the vessel (1), and the bubbler device (2a) positioned below the carrier (3) releases gas in the form of bubbles. Such bubbles function to stir the liquid in the vessel (1) to promote the washing of the semiconductor wafers. Then, the respective bubbling portions (10) releases gas into the liquid through the filter (11) and the filter support member (14) to generate bubbles, while the filter (11), consisting of a fine mesh, prevents the liquid from passing through the mesh due to the surface tension of the liquid to thereby hinder flowing of the liquid into the bubbling portions (10). In this connection a conventional bubbler, as shown in FIGS. 7 and 8, can not prevent the liquid from entering the bubbling portions (7) because the prior art bubbling portions have many holes (8) formed thereon. Accordingly, such a conventional bubbler has the aforementioned drawbacks and problems. On the contrary, our bubbler device includes the bubbling portions having a fine mesh, which prevents the liquid from flowing into the bubbler and thus obviates the drawback that the liquid in the vessel flows into the branch pipes (6) and the main pipe (5). Also, if the mesh of the filter (11) is blocked up, the cap (12) or the branch pipe (6) will be easily disassembled to change the filter, so that favorable bubbling will be effected.

As described above, in the bubbler device according to the invention, since the liquid in the rinse vessel does not penetrate into the bubbler and the filter is easily changed, the bubbling ability of the bubbler will not be hindered and also bacteria will not occur in the bubbler. Therefore this bubbler prevents the liquid from being contaminated by bacteria. Furthermore, even if there is a difference in height between opposed sides of the bubbling portions, the bubbling portions on both sides still continue to generate bubbles favorably.

Having now fully described the invention, it will be apparent to one of ordinary skill in the art that many changes and modifications can be made thereto without departing from the spirit or scope of the invention as set forth herein.

What is claimed is:

1. A bubbler device to be located near the bottom in a rinse vessel for washing semiconductor materials set in a carrier disposed above said bubbler device, said bubbler device comprising a main pipe through which pressurized gas is transferred, a suitable number of branch pipes connected with the main pipe and disposed on either side thereof, and bubbling portions located on the end of the respective branch pipes for the generation of bubbles, wherein each of said bubbling portions has a filter with a fine mesh of $0.1\mu$–$0.05\mu$, the filter being releasably mounted on an upper side of the bubbling portion, said branch pipes being of at least two different lengths alternately disposed longer and shorter along each side of said base pipe such that said bubbler portions are alternately disposed farther and nearer to said main pipe, to thereby generate fine bubbles through the respective filter so as to effectively stir a liquid and cause circulation thereof through said carrier in said vessel to promote the washing of the semiconductor materials without the penetration of liquid through the filter.

2. A bubbler device set forth in claim 1, wherein each said branch pipe is releasably connected with the main pipe.

3. A bubbler device set forth in claim 1, wherein the respective bubbling portions have a cap screw-threadedly mounted thereon, and said filter is located together with a filter support member between the end of the bubbling portion and an inwardly projected flanged portion of the cap.

4. In combination, a rinse vessel for washing semiconductor materials and the bubbler device as defined in claim 1.

* * * * *